United States Patent [19]

Moyal

[11] Patent Number: 5,896,068
[45] Date of Patent: Apr. 20, 1999

[54] VOLTAGE CONTROLLED OSCILLATOR (VCO) FREQUENCY GAIN COMPENSATION CIRCUIT

[75] Inventor: Nathan Y. Moyal, Austin, Tex.

[73] Assignee: Cypress Semiconductor Corp., San Jose, Calif.

[21] Appl. No.: 09/050,521

[22] Filed: Mar. 30, 1998

Related U.S. Application Data

[63] Continuation of application No. 08/766,389, Dec. 12, 1996, Pat. No. 5,748,048.

[51] Int. Cl.$^6$ .............................. H03B 5/04; H03L 7/099
[52] U.S. Cl. ......................... 331/34; 331/57; 331/177 R
[58] Field of Search ...................... 331/34, 57, 177 R, 331/177 V

[56] References Cited

U.S. PATENT DOCUMENTS

| | | | |
|---|---|---|---|
| 3,569,867 | 3/1971 | Ernst | 331/177 R |
| 4,230,953 | 10/1980 | Wilcox | 331/177 R |
| 4,970,472 | 11/1990 | Kennedy et al. | 331/8 |
| 5,126,692 | 6/1992 | Shearer et al. | 331/8 |
| 5,144,264 | 9/1992 | Chong et al. | 331/117 R |
| 5,250,911 | 10/1993 | Linder et al. | 330/149 |
| 5,307,071 | 4/1994 | Arnold et al. | 342/103 |
| 5,331,296 | 7/1994 | Davis | 331/158 |
| 5,399,994 | 3/1995 | Siniscalchi et al. | 331/17 |
| 5,537,388 | 7/1996 | Shinskey | 364/551.01 |
| 5,625,325 | 4/1997 | Rotzoll et al. | 331/16 |
| 5,770,965 | 6/1998 | Gritt, Jr. et al. | 327/349 |

OTHER PUBLICATIONS

"AX™ ATM–SONET/SDH Transceiver;" Cypress Semiconductor Corporation; Feb. 1994—Revised Nov. 1996; 1–80.

"MOS Oscillators with Multi–Decade Tuning Range and Gigahertz Maximum Speed", Banu, M., IEEE Journal of Solid–State Circuits, vol. SC–23, pp. 474–479, Apr. 1988.

*Primary Examiner*—Siegfried H. Grimm
*Attorney, Agent, or Firm*—Maiorana & Acosta, P.C.

[57] ABSTRACT

A voltage controlled oscillator (VCO) having a current gain compensation circuit includes a control circuit portion for generating a frequency control signal, and a ring oscillator responsive to the frequency control signal for outputting the VCO output signal. The control circuit includes a control transistor responsive to input control voltage $V_{control}$. Connected between the source terminal of the control transistor and ground is a resistive element in parallel with an N-channel field effect transistor and a P-channel field effect transistor, each configured to operate in saturation. The resistor, and the N-channel, and P-channel transistors provide parallel current paths which, collectively, form a control current that corresponds to the frequency control signal. As the voltage control signal $V_{control}$ increases beyond a predetermined level, the transistors conduct, and carry a current that is proportional to the square of the input control voltage $V_{control}$. Accordingly, the magnitude of total control current is dominated by the transistor-provided component, and assumes a square relationship, with respect to the input control voltage. This square-law current-voltage gain characteristic compensates for the inversely mirrored frequency gain characteristic of the ring oscillator in order to attain a reduced frequency gain variation for the overall VCO, with respect to control voltage variations. This reduction in variation translates to a reduced variation in the frequency gain of the VCO with respect to temperature variations when the VCO is used in a phase locked loop (PLL) circuit.

18 Claims, 3 Drawing Sheets

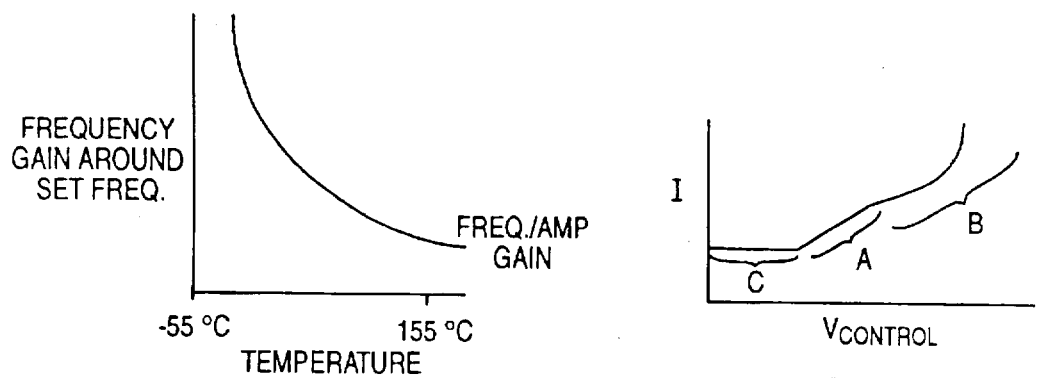
FIG. 3
FIG. 4
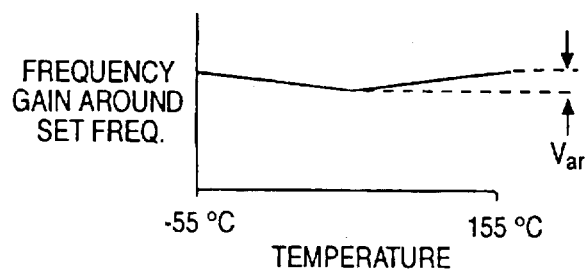
FIG. 5
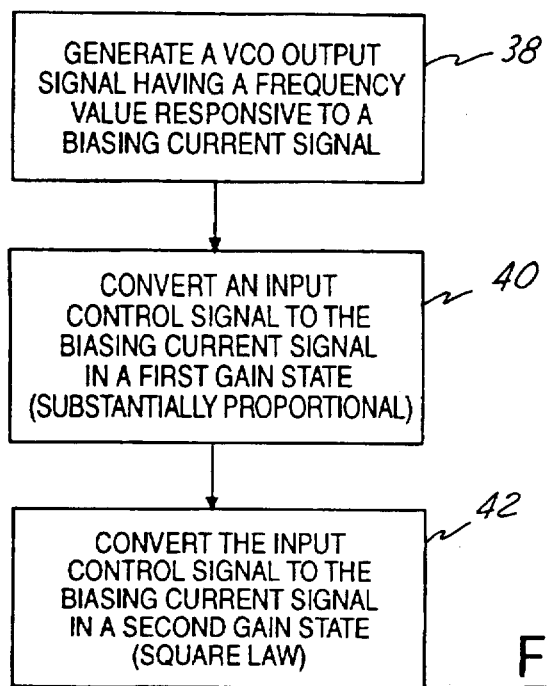
FIG. 6

5,896,068

VOLTAGE CONTROLLED OSCILLATOR (VCO) FREQUENCY GAIN COMPENSATION CIRCUIT

This application is a continuation of application Ser. No. 08/766,389 filed on Dec. 12, 1996, and now U.S. Pat. No. 5,748,048.

BACKGROUND OF THE INVENTION

1. Field of the Invention

The present invention relates generally to a voltage controlled oscillator, and, more particularly, to a gain compensation circuit for use with a voltage controlled oscillator.

2. Description of the Related Art

A voltage controlled oscillator (VCO) is commonly employed in a variety of applications, including communications, and timing circuitry. In particular, a VCO is commonly used in phase locked loop (PLL) control systems. Functionally, a VCO may be viewed as a circuit that seeks to transform an input control voltage signal to an output frequency signal in a substantially linear fashion. The frequency gain of a VCO typically defines the relationship between changes in the output frequency relative to predetermined changes in the input control voltage signal (delta frequency/delta volt).

One conventional construction for a VCO includes a first portion (an "input" stage) which converts an input voltage to a control current, and a second portion which transforms the control current into an output signal having a predetermined frequency based on the magnitude of the control current. For example, the above-mentioned second portion (a VCO "output" stage) of the VCO may comprise a plurality of differential current switches connected in series wherein the output of the last current switch is connected to the input of the first current switch (i.e., a so-called ring oscillator). As background, in such a structure, the control current may be "mirrored" into the plurality of current switches to control the output frequency (i.e., controlling the "biasing current"), or, alternatively, the magnitude of the control current may be used to control the load associated with the plurality of current switches—this also is operative to vary the output frequency of the VCO.

The first portion of the VCO, the structure which transforms an input voltage signal to the control current has been conventionally designed to have a linear response—ostensibly in order to effect a linear VCO input/output response. However, this linear control current does not take into account a non-linear current-to-frequency response of the above-mentioned second portion of the VCO—the plurality of VCO differential current switches. In particular, when operating at cold temperatures (e.g., –55° C.), the differential current switches require relatively low currents, due to improved transistor operating characteristics, in order to attain a predetermined output frequency.

Therefore, only correspondingly low input control voltages are required to develop the small control current in the input stage. Small changes in the control current (at cold temperatures) therefore result in relatively large output frequency variations. This relationship translates into a relatively high VCO frequency gain at cold temperatures.

However, at relatively hot temperatures (e.g., 155° C.), the VCO output stage will require a relatively higher control current (and therefore a correspondingly higher input control voltage to develop same) in order to attain the same predetermined output frequency (such as would be the case when the VCO is used in a PLL). This is due, in part, to degraded transistor operating characteristics at higher temperatures. This relationship translates into relatively low frequency gain at hot temperatures. The large frequency gain variation of conventional VCOs (over temperature) directly influences (adversely) a PLL transfer range. In addition, this frequency gain variation of the VCO with respect to temperature reduces flexibility of circuit design for PLL designers.

Thus, there is a need to provide an improved voltage controlled oscillator that minimizes or eliminates one or more of the problems set forth above.

SUMMARY OF THE INVENTION

One advantage of the present invention is that it reduces a VCO frequency gain variation relative to variations in input control voltages. This reduction in variation translates into a reduced frequency gain variation with respect to variations in temperature. This characteristic directly influences, positively, a PLL transfer range.

A voltage controlled oscillator, in accordance with the present invention, includes means for generating a VCO output signal having a frequency value responsive to a frequency control signal, and further includes means for generating the frequency control signal. The frequency control signal generating means includes means for modulating a control current signal between a first state and a second state as a function of an input control voltage signal. When in the first state, the modulating means is operable to increase the control current signal at a first rate substantially proportional to a rate of increase of the input control voltage signal. When in the second state, the modulating means is operable to increase the control current signal at a second rate that is substantially non-linear relative to the rate of increase of the input control voltage signal. In a preferred embodiment, the second, non-linear rate corresponds to a second order polynomial where the control current signal increases according to a square law of the input control voltage. Also in this preferred embodiment, the frequency control signal corresponds to the magnitude of the control current signal, and may take the form of the control current signal per se, or the form of a voltage potential (based on the control current signal) that varies a load portion of the VCO output signal generating means. The piece-wise response characteristic according to the invention inversely mirrors the current-frequency response of the VCO output signal generating means to yield, overall, a relatively constant gain over input control voltage variations. In a PLL, such reduction in variation translates to a corresponding reduction in variation of the frequency gain over temperature variations.

In a preferred embodiment, the means for generating the frequency control signal includes a control circuit having a control transistor with a gate terminal biased by the input control voltage signal. The modulating means, in the preferred embodiment, includes a passive device, such as a resistive element, connected between the control transistor and a reference node, such as ground, and an active device having a channel region connected between the control transistor, and ground. In an embodiment where the VCO output signal generating means includes both N-channel field effect transistors, and P-channel field effect transistors, the active device comprises an N-channel field effect transistor configured to operate substantially in saturation, arranged in parallel with a P-channel field effect transistor connected between the control transistor and ground, and also configured to operate substantially in saturation. In the first state, the magnitude of the control current signal is dominated by the resistive element (i.e, the input control voltage signal is relatively small and is thus insufficient to cause the active device to carry any appreciable amount of current). In the second state, when the input control voltage increases, the active device dominates, wherein the magnitude of the control current signal is proportional to the square of the input control voltage signal.

In further embodiments, the active device is at least one field effect transistor configured to compensate for a current-frequency gain characteristic of the VCO output signal generating means.

These and other features and objects of this invention will become apparent to one skilled in the art from the following detailed description and the accompanying drawings illustrating features of this invention by way of example.

BRIEF DESCRIPTION OF THE DRAWINGS

FIG. 3 is a simplified, frequency gain versus temperature graph of a response characteristic of VCO output signal generating means shown in FIG. 2.

FIG. 4 is a simplified, current gain versus input control voltage graph showing a plurality of gain states according to the present invention.

FIG. 5 is a simplified frequency gain versus temperature graph of a voltage controlled oscillator according to the present invention, particularly illustrating a reduced variation.

FIG. 6 is a flow chart diagram illustrating steps pertaining to the method according to the present invention.

DETAILED DESCRIPTION OF THE PREFERRED EMBODIMENTS

Figure 1:
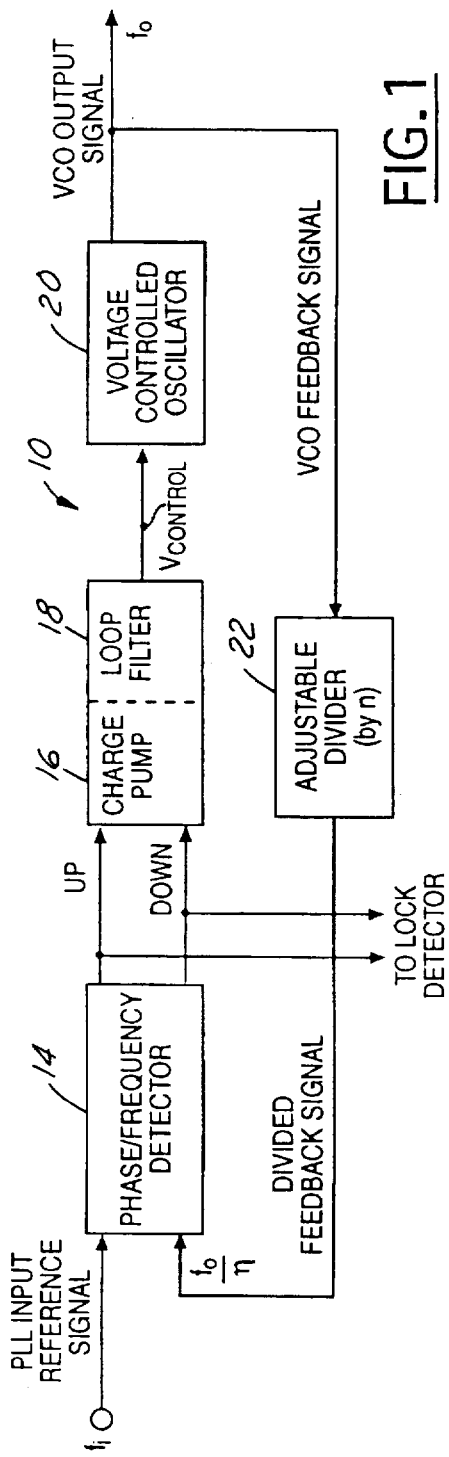
FIG. 1 is a simplified block diagram view of a preferred embodiment in which a voltage controlled oscillator according to the invention may be employed.

Referring now to the drawings wherein like reference numerals are used to identify identical components in the various views, FIG. 1 shows an exemplary phase locked loop (PLL) circuit 10 in which the inventive voltage controlled oscillator (VCO) according to the invention may be used. PLL circuit 10 may include a phase-frequency detector (PFD) 14, a charge pump 16, a loop filter 18, a voltage controlled oscillator (VCO) 20 according to the present invention, and, optionally, an adjustable divider 22.

While the general operation of PLL circuit 10 is well-known, a brief description for the purposes of completeness of description of the present invention will be hereinafter set forth. Phase-frequency detector (PFD) 14 may be a conventional PFD, and is responsive to a PLL input reference signal, $f_i$, and a VCO output signal, $f_o$, shown in FIG. 1 divided by n: $f_o/n$ (hereinafter, the "feedback signal"). PFD 14 may provide at least one, and conventionally, a plurality of out-of-lock indicative signals corresponding to whether, and to what extent, the feedback signal is phase-locked (or out-of-lock) with the input reference signal. In FIG. 1, the out-of-lock indicative signals may be the well known UP, and DOWN signals.

Charge pump 16 is responsive to the UP and DOWN signals and is provided for generating a control signal whose voltage potential corresponds to a phase error between the feedback signal, and the input reference signal, as indicated by the UP and DOWN signals. Charge pump 16 is conventional in the art, and may take any one of a plurality of well-known forms.

Loop filter 18 is coupled with charge pump 16 and is provided for amplifying, and shaping, the transfer characteristic of the generated control signal to output a modified control signal, $V_{control}$, to voltage controlled oscillator 20. The loop filter 18 may take the form of a low-pass filter.

VCO 20, according to the present invention, is controlled by way of the input control voltage $V_{control}$ and is operative to generate the VCO output signal $f_o$.

Generally, in operation, PLL circuit 10 is configured, such as by selection of a value of n and an input frequency $f_i$, to attain a desired output frequency $f_o$. As the ambient temperature goes down to relatively cold temperatures (e.g., $-55°$ C.), the output frequency of a conventional VCO goes up. This is due, in part, to the structure used in VCOs (greater detail of which will appear hereinafter). Particularly, the VCO output stages require less current due to improved transistor characteristics at colder temperatures; accordingly, as the temperature goes down, the control current being generated by the input control voltage $V_{control}$ will cause the output frequency to increase (temporarily—a transient). This increased output frequency $f_o$ will be fed back to PFD 14, and will result in a lowering of the magnitude of the control voltage $V_{control}$ to VCO 20, in a manner that is well-known. The decreased $V_{control}$ results in less control current being developed, which slows down the VCO to reach the predetermined frequency. This feedback is the way in which frequency correction occurs.

Conversely, as the temperature goes up from a nominal operating temperature, the output frequency $f_o$ will decrease (again, transiently until corrected) due to degraded transistor operating characteristics at higher temperatures. This reduced frequency is fed back to PFD 14, and results in an increase in the magnitude of the input control voltage $V_{control}$ to VCO 20. This increased $V_{control}$ generates an increased amount of current to elevate the output frequency to reach the predetermined value.

Based on the foregoing, it should be appreciated that temperature variations, in the context of PLL circuit 10, will cause a corresponding variation in the magnitude of the input control voltage $V_{control}$. By flattening the frequency gain of VCO 20 with respect to variations in the input control voltage $V_{control}$, the present invention reduces the variation in frequency gain with respect to temperature, preferably at a preselected frequency.

Figure 2:
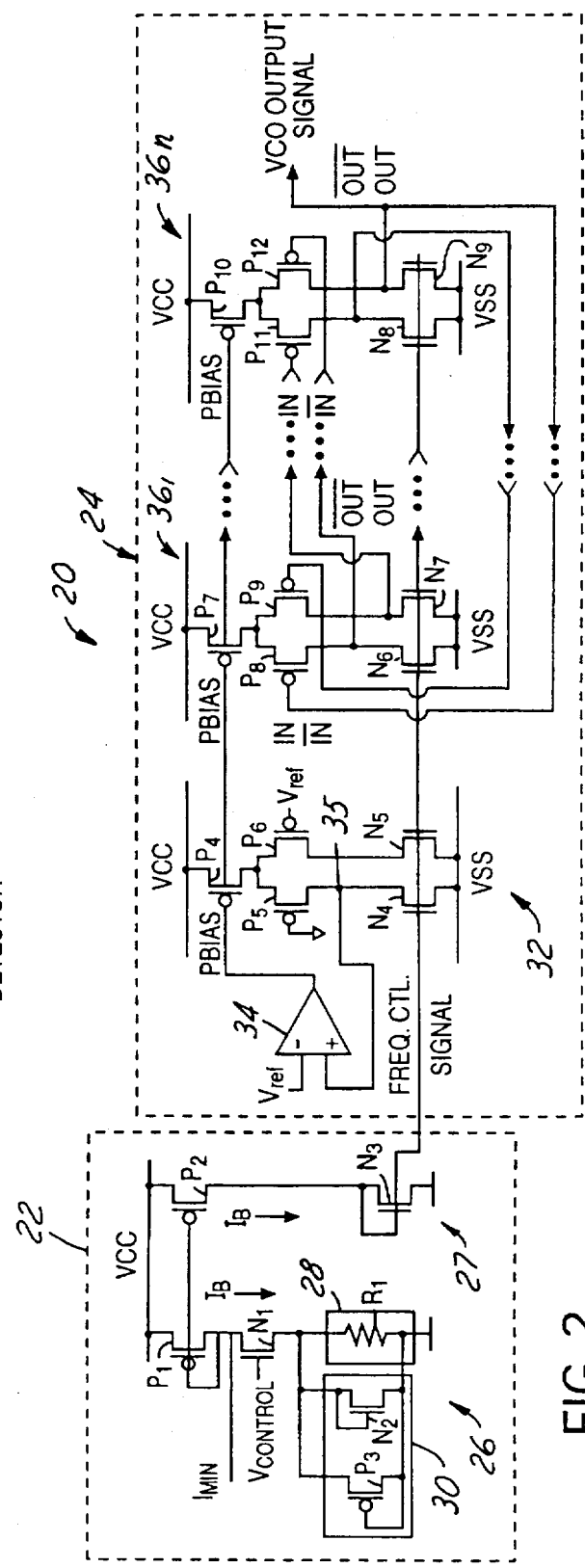
FIG. 2 is a simplified, schematic diagram view showing, in greater detail, the voltage controlled oscillator illustrated in FIG. 1, particularly including a gain compensation circuit.

Referring now to FIG. 2, a simplified schematic diagram view of a VCO 20 according to the present invention is shown. VCO 20 includes means or circuit 22 for generating a frequency control signal, and, means or circuit 24 for generating a VCO output signal having a frequency value responsive to the frequency control signal. It is generally well known that VCO gain control may be established by controlling either the available biasing current, such as the herein described control current, to a VCO output stage (e.g., circuit 24), or, alternatively, controlling a load portion contained in the VCO output circuit. The embodiment according to the invention, as will be described in detail hereinafter, is implemented by controlling the load and the biasing current. It should be understood, however, that alternate implementations, including but not limited to controlling the available biasing current to the VCO output stage, is fully within the spirit and scope of the present invention.

Means or control circuit 22 is responsive to the input control voltage signal $V_{control}$ for establishing a control current signal $I_B$, which is used for generating the frequency control signal that is provided as an input to circuit 24. Control circuit 22 includes leg 26 and leg 27 configured in a current mirror arrangement; that is, the current $I_B$ that flows through leg 26 is mirrored in leg 27, as shown in FIG. 2.

Leg 26 includes a P-channel field effect transistor $P_1$, a control transistor, such as an N-channel field effect transistor $N_1$, and a modulating means for modulating the control current signal $I_B$ between a first gain state and a second gain state as a function of the input control voltage signal $V_{control}$. The modulating means includes, in a preferred embodiment, a passive element 28, and an active element 30 having at least one conductive channel region in parallel with element 28. In the embodiment shown in FIG. 2, the passive element 28 comprises a resistive element $R_1$, and the active element 30 comprises an N-channel field effect transistor $N_2$, and a P-channel field effect transistor $P_3$. Both transistors $N_2$ and $P_3$ are configured for operation substantially in a saturation region (when $V_{control}$ increases to a predetermined turn-on threshold voltage). It should be appreciated that when the transistors $N_2$ and $P_3$ operate in saturation, a current therethrough assumes a level that is proportional to the square of the applied gate potential.

The operation of the modulating means portion of leg 26 will be set forth in greater detail below; however, generally, as the magnitude of the input control voltage $V_{control}$ increases, the conductivity of control transistor $N_1$ increases, thereby allowing the magnitude of the control current signal $I_B$ to increase.

Leg 26 of circuit 22 further includes an input line connected to a current source (not shown) for receiving a predetermined minimum current $I_{min}$. $I_{min}$ is provided to insure a minimum biasing current $I_B$ when the input control voltage $V_{control}$ is zero (or at least no greater than the threshold level vt of transistor $N_1$).

Leg 27 of control circuit 22 includes a P-channel field effect transistor $P_2$, and an N-channel field effect transistor $N_3$. Transistor $P_2$ is configured to mirror the current flowing through transistor $P_1$; therefore, a substantially identical magnitude current $I_B$ also flows through transistor $P_2$. As the magnitude of the control current signal $I_B$ varies, the potential of the frequency control signal, as derived from transistor $N_3$, also varies, and is provided as an input to circuit 24.

Circuit 24, as described above, generates the VCO output signal $f_0$ having a frequency value that is responsive to the magnitude of the frequency control signal—here, the potential derived from the gate terminal of $N_3$. Circuit 24 includes a biasing circuit 32, and a plurality of VCO stages $36_1, \ldots, 36_n$.

Biasing circuit 32 includes an operational amplifier 34, a current control transistor, such as a P-channel field effect transistor $P_4$, differentially arranged input transistors, such as a P-channel field effect transistor $P_5$, and a P-channel field effect transistor $P_6$, and differentially arranged variable loads, such as a load N-channel field effect transistor $N_4$, and a load N-channel field effect transistor $N_5$. Biasing circuit 32 performs at least two functions: first, it controls the magnitude of the VCO output signal to a predetermined level established by $V_{REF}$, and, second, it controls the current through the VCO stages $36_1, \ldots, 36_n$. Note that the structure of biasing circuit 32 is substantially similar (except for operational amplifier 34) as the VCO stages $36_1, \ldots, 36_n$. Transistor $P_4$ is controlled to adjust the current level through biasing circuit 32 by way of a bias signal PBIAS from op amp 34. Transistors $P_5$, and $P_6$ have respective gate terminals that operate as inputs of the biasing circuit 32, while transistors $N_4$, and $N_5$ operate as loads which vary in magnitude according to the magnitude of the frequency control signal. Node 35 between transistor $P_5$, and $N_4$ provides an output which is fed to a non-inverting input of op amp 34, while the inverting input of op amp 34, and a gate terminal of transistor $P_6$ both receive the $V_{REF}$ signal.

In operation, it may be desired to regulate the VCO output signal to a maximum predetermined voltage magnitude, for example, one volt. To accomplish this, the $V_{REF}$ signal may be defined as one volt, and applied to op amp 34, and transistor $P_6$. Op amp 34 will vary the current through transistor $P_4$ so that the signal levels on its inverting, and non-inverting inputs are substantially the same, as is well known. Therefore, node 35 will also assume the level of signal $V_{REF}$. Since the structure of biasing circuit 32 is identical to the structure of the VCO stages $36_1, \ldots, 36_n$, the level of $V_{REF}$, at its maximum, will also appear on corresponding nodes of, for example, VCO stage $36_n$, which generates the VCO output signal.

VCO stages $36_1, \ldots, 36_n$ are connected in-series with the output of a first stage being connected to the input of the next succeeding stage. The output of the last stage $36_n$ is connected to the input of the first stage $36_1$. This arrangement forms a so-called "ring oscillator". Typically, a VCO may contain three to five such stages. Each stage forms what is known as a differential current switch. As mentioned above, the structure of each of the VCO stages 36 is identical to each other, and, are each identical to the biasing circuit 32. That is, for example, transistors $P_4$, $P_7$, and $P_{10}$ are all sized the same so that a predetermined biasing potential PBIAS, to which the respective gate terminals of each of these transistors are tied to receive, will produce a substantially similar current therethrough. Likewise, transistors $N_4$, $N_5$, $N_6$, $N_7$, $N_8$ and $N_9$ are also similarly sized, and whose respective gate terminals are all tied to receive the frequency control signal from transistor $N_3$. In this way, changes in the frequency control signal operate to change the load in each of the VCO stages (as well as the biasing circuit 32) in a substantially identical manner. Other similarities deriving from the identical structure will be appreciated by those of ordinary skill in the art.

As should be understood by one of ordinary skill in the art, the frequency of the VCO 20 depends on the ring propagation delay, the number of rings, the type of biasing used (i.e., as alluded to above, current control, or load control, among others) and, to some degree, on the small signal gain, and the swing-level of the output signal.

Referring now to FIG. 3, the frequency gain of circuit 24, in response to a linear voltage-current input as provided by conventional VCOs, would be non-linear in nature, with fairly high gain at low temperatures, and fairly low gain at high temperatures (as described above). This variation is due to changing transistor characteristics over temperature (see Background). The present invention, however, provides current gain compensation to substantially "flatten" the frequency gain response over input voltages, and ultimately, temperature.

The overall gain of VCO 20 gain may be described by the following: df/dv=df/di (circuit 24)* di/dv (circuit 22).

Referring now particularly to FIGS. 2, and 4, the operation of the inventive current gain compensation technique, as embodied in circuit 22, will now be set forth. In particular, as shown in FIG. 4, the current gain versus input control voltage of circuit 22 inversely mirrors the frequency gain shown in FIG. 3 (with a linear current-voltage response characteristic). In the preferred embodiment shown in FIG. 2, this response is accomplished by providing alternate current carrying paths in parallel. One path is defined by resistive element $R_1$. The second path is defined by transistor $N_2$ configured to operate in saturation in parallel with transistor $P_3$, also configured to operate in saturation.

In operation VCO output signal generating means 24 generates the VCO output signal having a frequency value that depends on the magnitude of the frequency control signal. This generation step is shown as step 38 in FIG. 6.

When operating VCO 20 at relatively cold temperatures, the input control voltage applied thereto, $V_{control}$, in the context of PLL circuit 10, will assume lower magnitudes. In particular, at very low input voltages of $V_{control}$ (i.e., less than vt) $N_1$ does not conduct. Therefore $I_{min}$ provides a minimum current for $I_B$. The response to this is shown as Region C in FIG. 4.

At slightly increased magnitudes of $V_{control}$, a low, and linearly controllable voltage versus current response is exhibited by circuit 22, since $N_1$ begins to conduct. The control current signal $I_B$ is dominated by the current flowing through the path defined by element $R_1$ (i.e., resistor dominated: current proportional to ($V_{control}$ minus vt)/$R_1$). That is, the control current signal increases at a first rate that is substantially proportional to the rate of increase of $V_{control}$. The transistors $N_2$ and $P_3$ are not yet conducting because $V_{control}$ is not high enough. The current gain for this linear region depends on the size of the passive device 28 being used. This linear region, shown as Region A in FIG. 4, therefore defines a first gain state of VCO 20. The conversion of an input control signal to a current control signal in a first gain state is shown in step 40 of FIG. 6.

At relatively high temperatures, which tend to reduce the output frequency of VCO 20, a corresponding increase in the magnitude of the input control voltage $V_{control}$ results (to correct and raise $f_o$), as described above in the context of using VCO 20 in PLL circuit 10. The magnitude of the control current signal $I_B$, for values of $V_{control}$ greater than a predetermined value, varies non-linearly, the precise magnitude of which is selected to compensate for a current/frequency gain characteristic of VCO output signal generating means 24. The relationship may be described, generally, by the polynomial equation as follows:

$$I_B = A_0 + A_1 * V_{control} + A_2 * V_{control}^2 + A_3 * V_{control}^3 + \ldots + A_n * V_{control}^n$$

Where: $I_B$=the magnitude of the control current;

$V_{control}$=the magnitude of the input control voltage;

$A_0$–$A_n$=term coefficients; and, n varies from 0 to ∞.

In the preferred embodiment, only the constant, first, and second-order terms are used to describe the relationship between the input control voltage signal $V_{control}$ and the resulting control current signal $I_B$; however, it should be appreciated that any non-linear response adapted for compensation (as described in the immediately preceding paragraph) is within the spirit and scope of the invention. The square law response being a special case employed in the preferred embodiment.

Thus, the magnitude of the control current signal $I_B$, for hot temperatures, is dominated by the current being carried by the parallel paths defined through the transistors $N_2$ and $P_3$ (transistor dominated: current proportional to (KW/2L) * (($V_{control}$–vt)–vt) square). This square law response, it should be understood, is an approximation developed for describing the voltage/current characteristic of a field effect transistor configured for operation in the saturation region.

Thus, the control current signal $I_B$ increases at a second rate that is substantially proportional to the square of the magnitude of the rate of increase of $V_{control}$. The response is shown as Region B in FIG. 4, and defines a second gain state of VCO 20. The step of converting the input control signal to the control current signal in the second gain state (according to a square law), is shown as step 42 in FIG. 6.

Thus, at cold temperatures, the high frequency gain of circuit 24 of VCO 20 is countered by the relatively low current gain of circuit 22 incorporating the current gain compensation technique of the present invention. At hot temperatures, the low frequency gain of circuit 24 is compensated by the relatively high gain of the current compensation technique employed in circuit 22. The result is an overall VCO frequency-to-input voltage gain which is nearly constant over input voltage. In the context of the use of VCO 20 in PLL circuit 10, this flat, nearly constant frequency gain translates to a nearly constant frequency gain versus temperature characteristic (see FIG. 5).

The particular arrangement of the active element 30 shown in FIG. 2 is adapted to compensate for a current versus frequency gain characteristic of VCO output signal generating circuit 24. Specifically, in circuit 24, a PMOS differential stage, and an NMOS load structure is employed. The structure used in active element 30 also employs NMOS and PMOS technology to compensate for the frequency gain characteristic of circuit 24.

Figure 7:
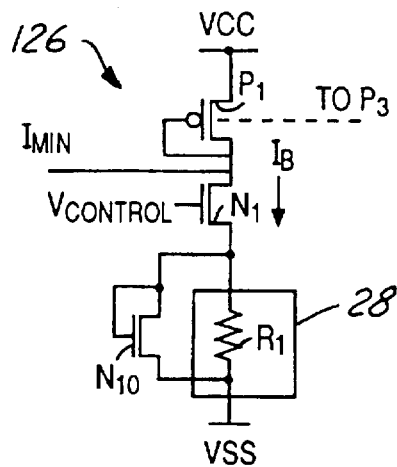
FIGS. 7–10 illustrate alternate embodiments of a control circuit portion of the VCO illustrated in FIG. 2.

FIG. 7 shows an alternate embodiment 126 for a portion of the control circuit 22. This alternate embodiment includes an N-channel field effect transistor $N_{10}$, configured to operate in saturation, having a channel region connected in parallel with the current path through resistive element $R_1$. This structure is particularly adapted to compensate for the low frequency gain influenced by an NMOS structure employed in VCO 20 (particularly the VCO output signal generating portion 24).

Figure 8:
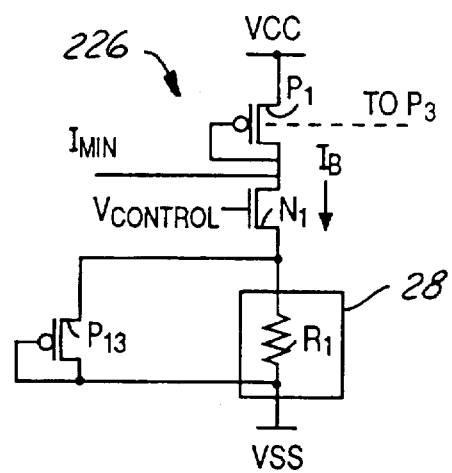

FIG. 8 shows a second alternate embodiment 226. Circuit 226 includes a P-channel field effect transistor $P_{13}$ configured to operate in saturation. Circuit 226 is operative to carry a current $I_B$ which compensates for the low frequency gain caused by a PMOS structure in VCO 20.

Figure 9:
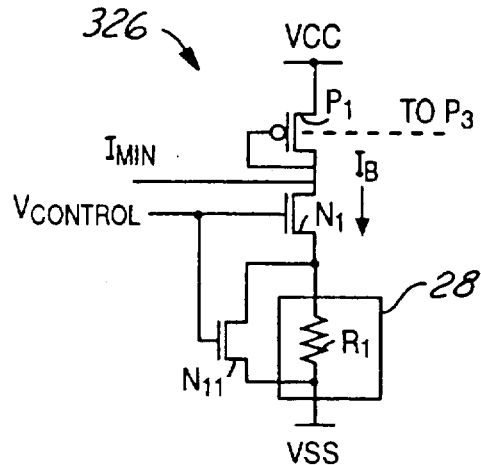

FIG. 9 shows a third alternate embodiment 326, which includes an N-channel field effect transistor $N_{11}$. In circuit 326, transistor $N_{11}$ is configured for active operation, having its gate terminal connected to the gate terminal of transistor $N_1$, both gates being coupled to receive the input control voltage $V_{control}$. The channel region of transistor $N_{11}$ is arranged in parallel with resistor $R_1$ to provide parallel current paths for the build-up of current $I_B$. In this configuration, transistor $N_{11}$ will turn on, and begin conduction earlier than, for example, the configuration of embodiment 126 in FIG. 7. This translates to an increased current gain compensation at an earlier point on the input control voltage curve. The effect of the resistor $R_1$ in this configuration, relative to the current in transistor $N_{11}$, is minimized. It should be noted that once $V_{control}$ increases to a point where transistor $N_{11}$ operates in the saturation region, that the current contribution to $I_B$ is of a magnitude that is proportional to the square of the input control voltage $V_{control}$.

Figure 10:
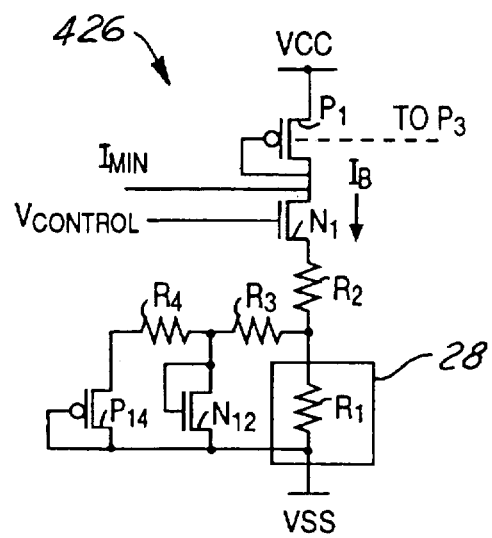

FIG. 10 illustrates a fourth alternate embodiment 426, which includes a P-channel field effect transistor $P_{14}$, an N-channel field effect transistor $N_{12}$, and resistive elements $R_2$, $R_3$, and $R_4$. The addition of passive, resistive elements between the active devices provides the means by which the particular turn-on points (i.e., the predetermined input control voltage $V_{control}$) of each active element can be controlled individually in order to tailor the current gain response.

While the invention has been particularly shown and described with reference to the preferred embodiments thereof, it is well understood by those skilled in the art that various changes and modifications can be made in the invention without departing from the spirit and scope of the invention, which is limited only by the appended claims.

I claim:

1. A signal generator comprising:

means for generating an output signal having a value responsive to a control signal applied thereto; and, means for generating said control signal including means for modulating a control current signal between a first state and a second state as a function of an input signal, said control signal corresponding to said control current signal;

wherein when in said first state said modulating means is configured to increase said control current signal at a first rate substantially proportional to a rate of increase of said input signal, and when in said second state said modulating means is operable to increase said control current signal at a second rate that is substantially non-linear relative to said rate of increase of said input signal to thereby reduce a variation in a gain characteristic of said signal generator.

2. The generator of claim 1 wherein said second rate is substantially in accordance with the square of said rate of increase of said input signal.

3. The generator of claim 1 wherein said output signal generating means includes a plurality of stages connected in a series arrangement.

4. The generator of claim 3 wherein said output signal generating means includes a biasing circuit responsive to said control signal for driving said plurality of stages.

5. The generator of claim 1 wherein said control signal generating means includes a control transistor having a gate terminal biased by said input signal, and wherein said modulating means includes a passive device connected between said control transistor and a reference node, and an active device having a channel region connected between said control transistor and said reference node.

6. The generator of claim 5 wherein said passive device comprises a resistive element and wherein said active device is at least one field effect transistor (FET) configured to compensate for a current/frequency gain characteristic of said output signal generating means.

7. The generator of claim 6 wherein said one FET comprises an n-channel field effect transistor configured to operate substantially in saturation.

8. The generator of claim 7 wherein said modulating means further includes a p-channel field effect transistor having a channel region connected between said control transistor and said reference node, and configured to operate substantially in saturation.

9. The generator of claim 6 wherein said one FET comprises a p-channel field effect transistor configured to operate substantially in saturation.

10. The generator of claim 6 wherein said one FET comprises an n-channel field effect transistor having a gate terminal coupled to receive said input signal.

11. The generator of claim 10 wherein said modulating means further includes a p-channel field effect transistor having a channel region connected between said control transistor and said reference node, and further having a gate terminal coupled to receive said input signal.

12. The generator of claim 6 wherein said one FET comprises a p-channel field effect transistor having a gate terminal coupled to receive said input signal.

13. The generator of claim 1 wherein said control signal generating means includes a control transistor having a gate terminal biased by said input signal, and wherein said modulating means includes a first resistive element and a second resistive element sharing a first common node and together coupled in-series between said control transistor and a reference node, a third resistive element and a fourth resistive element sharing a second common node and together coupled in-series between said first common node and a distal node, an n-channel field effect transistor having a channel region coupled between said second common node and said reference node, and a p-channel field effect transistor having a channel region coupled between said distal node and said reference node wherein said n-channel field effect transistor and said p-channel field effect transistor being configured for operation in saturation.

14. A signal generator comprising:

an output circuit configured to generate an output signal having a value responsive to a control signal applied thereto;

a control circuit having an output for generating said control signal as a function of an input signal, said control circuit further including a control transistor having a first channel region for carrying a control current signal and a gate terminal coupled to receive said input signal, said control circuit further including a resistive element coupled between one end of said first channel and a reference node, said control circuit further including an active device having a second channel region coupled between said one end and said reference node;

wherein a magnitude of said control current signal comprises the sum of the respective currents through said resistive element and said active device as a function of said input signal.

15. The generator of claim 14 wherein said active device comprises an n-channel field effect transistor configured to operate in saturation, and a p-channel field effect transistor having a third channel region connected in parallel with said second channel region and configured to operate in saturation.

16. A method of operating a signal generator, said method comprising the steps of:

(A) generating an output signal having a value responsive to a biasing current signal;

(B) converting an input signal to a control current signal in a first state wherein a first rate of increase of said control current signal is substantially proportional to a rate of increase of said input signal; and, (C) converting said input signal to said control current signal in a second state wherein a second rate of increase of said control current signal is substantially non-linear relative to said rate of increase of said input signal to thereby reduce a variation in a gain characteristic of said generator.

17. The method of claim 16 wherein said second rate is substantially in accordance with the square of said rate of increase of said input signal.

18. The method of claim 17 wherein step (C) includes the substep of:

conducting said control current signal through at least one active device responsive to said input signal whose current/voltage characteristic is non-linear.

* * * * *